(12) United States Patent
Terakawa

(10) Patent No.: US 12,179,308 B2
(45) Date of Patent: Dec. 31, 2024

(54) METHOD OF TRANSFERRING SEMICONDUCTOR WAFER TO POLISHING APPARATUS AND METHOD OF PRODUCING SEMICONDUCTOR WAFER

(71) Applicant: SUMCO CORPORATION, Tokyo (JP)

(72) Inventor: Ryoya Terakawa, Saga (JP)

(73) Assignee: SUMCO CORPORATION, Tokyo (JP)

( * ) Notice: Subject to any disclaimer, the term of this patent is extended or adjusted under 35 U.S.C. 154(b) by 322 days.

(21) Appl. No.: 17/788,834

(22) PCT Filed: Oct. 13, 2020

(86) PCT No.: PCT/JP2020/038637
§ 371 (c)(1),
(2) Date: Jun. 24, 2022

(87) PCT Pub. No.: WO2021/131243
PCT Pub. Date: Jul. 1, 2021

(65) Prior Publication Data
US 2023/0033545 A1 Feb. 2, 2023

(30) Foreign Application Priority Data

Dec. 25, 2019 (JP) .................. 2019-234575

(51) Int. Cl.
*B24B 37/34* (2012.01)
*B24B 37/04* (2012.01)
(Continued)

(52) U.S. Cl.
CPC ............ *B24B 37/345* (2013.01); *B24B 37/04* (2013.01); *B24B 37/30* (2013.01); *B24B 37/34* (2013.01);
(Continued)

(58) Field of Classification Search
None
See application file for complete search history.

(56) References Cited

U.S. PATENT DOCUMENTS

| 5,979,475 A | 11/1999 | Satoh et al. |
| 6,312,312 B1 | 11/2001 | Togawa et al. |

(Continued)

FOREIGN PATENT DOCUMENTS

| JP | H08-264626 | 10/1996 |
| JP | H11-188620 | 7/1999 |

(Continued)

OTHER PUBLICATIONS

International Search Report issued in International Patent Application No. PCT/JP2020/038637, dated Dec. 22, 2020, along with an English translation thereof.

(Continued)

*Primary Examiner* — Jiong-Ping Lu
(74) *Attorney, Agent, or Firm* — Greenblum & Bernstein, P.L.C.

(57) ABSTRACT

Provided is a method of transferring a semiconductor wafer to a single-side polishing apparatus without forming scratches on the surface of the semiconductor wafer. The method includes: starting to splay the liquid from each spray hole; placing the semiconductor wafer on the retainer portion to hold a surface of the semiconductor wafer by suction without contact, and raising the tray to attach the semiconductor wafer to the polishing head, wherein a period of time from a point at which the semiconductor wafer is held by the retainer portion to a point at which the attaching of the semiconductor wafer W to the polishing head is completed is 5 s or more, or wherein a ratio of a total area of the protrusions to an area of the semiconductor wafer is 15% or more.

18 Claims, 2 Drawing Sheets

(51) Int. Cl.
*B24B 37/30* (2012.01)
*B24B 41/06* (2012.01)
*H01L 21/02* (2006.01)
*H01L 21/304* (2006.01)
*H01L 21/306* (2006.01)
*H01L 21/67* (2006.01)

(52) U.S. Cl.
CPC ...... *B24B 41/061* (2013.01); *H01L 21/02024* (2013.01); *H01L 21/304* (2013.01); *H01L 21/30625* (2013.01); *H01L 21/67092* (2013.01); *B24B 41/06* (2013.01)

(56) References Cited

U.S. PATENT DOCUMENTS

2003/0236056 A1* 12/2003 Boo .................. B24B 37/04
                                              451/24
2007/0264914 A1* 11/2007 Isobe ............... H01L 21/68742
                                              451/54
2016/0300750 A1    10/2016  Iwasaka et al.

FOREIGN PATENT DOCUMENTS

| JP | 2002-231671 | 8/2002 |
| JP | 2005-019439 | 1/2005 |
| JP | 2009-028862 | 2/2009 |
| JP | 2016-197690 | 11/2016 |
| JP | 2017-92228 | 5/2017 |
| JP | 2017-092397 | 5/2017 |
| WO | 2015/083613 | 6/2015 |

OTHER PUBLICATIONS

International Preliminary Report on Patentability issued in Corresponding International Patent Application No. PCT/JP2020/038637, dated Jun. 28, 2022, along with an English translation thereof.

* cited by examiner

METHOD OF TRANSFERRING SEMICONDUCTOR WAFER TO POLISHING APPARATUS AND METHOD OF PRODUCING SEMICONDUCTOR WAFER

TECHNICAL FIELD

This disclosure relates to a method of transferring a semiconductor wafer to a polishing apparatus and a method of producing a semiconductor wafer.

BACKGROUND

Conventionally, silicon wafers are widely used as substrates for semiconductor devices. Silicon wafers are produced by sequentially subjecting a single crystal silicon ingot to slicing, lapping, etching, double-side polishing, single-side polishing, cleaning, and others.

Of the above processes, single-side polishing is a process for increasing the planarity by eliminating irregularities and undulations on a surface of a silicon wafer, and is performed by mirror polishing on a silicon wafer by chemical mechanical polishing (CMP).

The single-side polishing is performed using a single-wafer processing single-side polishing apparatus. This single-side polishing apparatus includes a rotating plate to which a polishing cloth is attached and a polishing head that presses and holds a silicon wafer on the polishing plate, and polishes a surface of the silicon wafer to be polished by rotating both the rotating plate and the polishing head while supplying a slurry.

Now, when a silicon wafer having been subjected to double-side polishing is transferred to a single-side polishing apparatus, typically, a peripheral portion of the silicon wafer is held by a transfer means such as a transfer arm, and the silicon wafer is once placed on a temporary cradle and then transferred to the polishing head of the single-side polishing apparatus.

As such a temporary cradle, for example, JP 2016-197690 A (PTL 1) discloses one including a tray that is made of a polyvinyl chloride (PVC) sponge and is configured to be liftable, the tray is raised to hold, by contact, a surface of a semiconductor wafer to be polished, thereby transferring the semiconductor wafer to a polishing head of a single-side polishing apparatus.

CITATION LIST

Patent Literature

PTL 1: JP 2016-197690 A

SUMMARY

Technical Problem

With the temporary cradle disclosed in PTL 1, the sponge is brought into contact with the surface (surface to be polished) of the semiconductor wafer, so that scratches may be formed on the surface of the semiconductor wafer.

It could therefore by helpful to provide a method of transferring a semiconductor wafer to a single-side polishing apparatus without forming scratches on a surface of the semiconductor wafer.

Solution to Problem

We propose the following features to solve the above problem.

[1] A method of transferring a semiconductor wafer to be polished to a single-side polishing apparatus by placing the semiconductor wafer on a temporary cradle, and then, transferring the semiconductor wafer to a polishing head of the single-side polishing apparatus,
  the temporary cradle comprising:
    a retainer portion that holds a peripheral portion of the semiconductor wafer;
    a tray that is configured to be liftable and has a plurality of ring-shaped protrusions on a surface of the tray, with each protrusion having an inner wall provided with a spray hole through which a liquid is sprayed along the inner wall, such that the semiconductor wafer is held by suction without contact by spraying the liquid from each spray hole; and
    a guide portion that is placed around the semiconductor wafer and aligns the semiconductor wafer when the semiconductor wafer is raised by raising the tray,
  the method comprising:
    starting to splay the liquid from each spray hole at a first flow rate;
    placing the semiconductor wafer on the retainer portion to hold a surface to be polished of the semiconductor wafer by suction without contact with the tray, and
    raising the tray to attach the semiconductor wafer to the polishing head after that,
    wherein a period of time from a point at which the semiconductor wafer is held by the retainer portion to a point at which the attaching of the semiconductor wafer to the polishing head is completed is 5 s or more.

[2] A method of transferring a semiconductor wafer to be polished to a single-side polishing apparatus by placing the semiconductor wafer on a temporary cradle, and then, transferring the semiconductor wafer to a polishing head of the single-side polishing apparatus,
  the temporary cradle comprising:
    a retainer portion that holds a peripheral portion of the semiconductor wafer;
    a tray that is configured to be liftable and has a plurality of ring-shaped protrusions on a surface of the tray, with each protrusion having an inner wall provided with a spray hole through which a liquid is sprayed along the inner wall, such that the semiconductor wafer is held by suction without contact by spraying the liquid from each spray hole; and
    a guide portion that is placed around the semiconductor wafer and aligns the semiconductor wafer when the semiconductor wafer is raised by raising the tray,
  the method comprising:
    starting to splay the liquid from each spray hole at a first flow rate;
    placing the semiconductor wafer on the retainer portion to hold a surface to be polished of the semiconductor wafer by suction without contact with the tray, and
    raising the tray to attach the semiconductor wafer to the polishing head after that,
    wherein a ratio of a total area of the plurality of ring-shaped protrusions to an area of the semiconductor wafer is 15% or more.

[3] The method of transferring a semiconductor wafer to a polishing apparatus, according to [1] or [2] above, wherein a flow rate of the liquid during a period from the raising of the tray to the attaching of the semiconductor wafer to the polishing head is a second flow rate higher than the first flow rate.

[4] The method of transferring a semiconductor wafer to a polishing apparatus, according to [1] or [2] above, wherein after the semiconductor wafer is transferred to the polishing head, the surface of the semiconductor wafer to be polished is polished using the single-side polishing apparatus; the semiconductor wafer is then removed from the polishing head, followed by starting spraying of the liquid from each spray hole at the first flow rate again; the semiconductor wafer having been polished is then placed on the retainer portion to hold the polished surface of the semiconductor wafer by suction without contact with the tray; and the tray is raised to attach the semiconductor wafer to the polishing head after that.

[5] A method of producing a semiconductor wafer, comprising:
  slicing a single crystal ingot grown by a given method to obtain a semiconductor wafers;
  subjecting the semiconductor wafer obtained to lapping, etching, and double-side polishing; and
  then transferring the semiconductor wafer to a single-side polishing apparatus by the method of transferring a semiconductor wafer to a polishing apparatus, according to any one of [1] to [4] above; and
  polishing a surface of the semiconductor wafer by the single-side polishing.

[6] The method of producing a semiconductor wafer, according to [5] above, wherein the semiconductor wafer is a silicon wafer.

Advantageous Effect

This disclosure can transfer a semiconductor wafer to a single-side polishing apparatus without forming scratches on the surface of the semiconductor wafer.

BRIEF DESCRIPTION OF THE DRAWINGS

In the accompanying drawings.

DETAILED DESCRIPTION (Method of Transferring Semiconductor Wafer to Polishing Apparatus)

Figure 1:
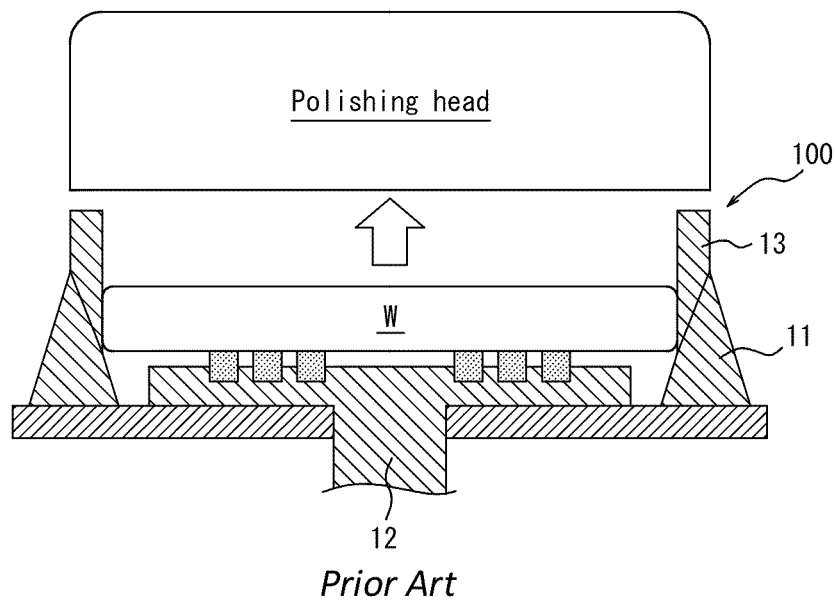
FIG. 1 is a diagram illustrating a temporary cradle disclosed in PTL 1.

Embodiments of this disclosure will now be described with reference to the drawings. FIG. 1 illustrates a temporary cradle disclosed in PTL 1. A temporary cradle 100 depicted in FIG. 1 includes a retainer portion 11 that holds a peripheral portion of a semiconductor wafer W; a tray 12 that is made of a PVC sponge and is configured to be liftable; and a guide portion 13 that is placed around the semiconductor wafer W and aligns the semiconductor wafer W when the semiconductor wafer W is raised by raising the tray 12.

In such a temporary cradle 100, when the semiconductor wafer W is placed on the retainer portion 11 and the tray 12 is raised by an elevating mechanism (not shown), the tray 12 holds a surface of the semiconductor wafer W to be polished, by contact to raise the semiconductor wafer W and transfer the semiconductor wafer W to a polishing head of a single-side polishing apparatus. Accordingly, scratches may be formed on the surface of the semiconductor wafer W (surface to be polished).

The present inventor considered that in order to transfer the semiconductor wafer W to the polishing head without forming scratches the surface of the semiconductor wafer W, instead of using a contact-type temporary cradle like the temporary cradle 100 depicted in FIG. 1, using a non-contact one would be best suited, and contemplated using a Bernoulli type temporary cradle.

Figure 2:
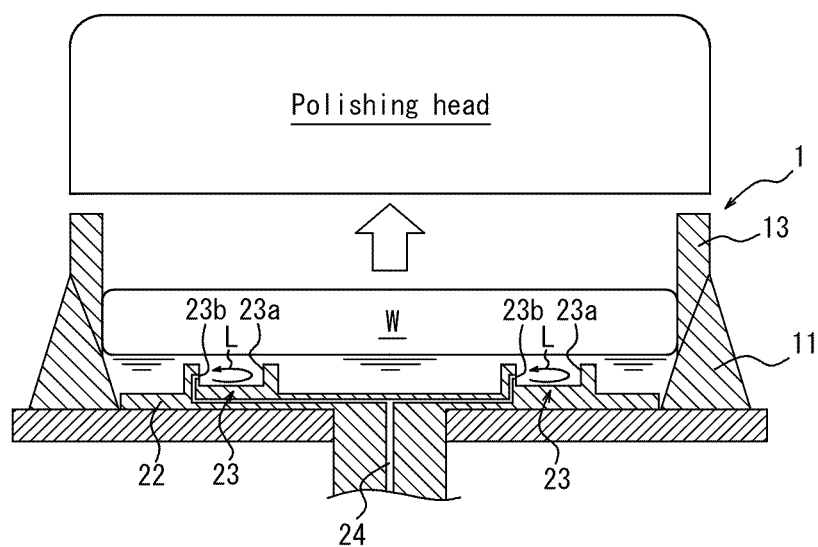
FIG. 2 is a diagram illustrating an example of a temporary cradle that can be used in this disclosure.
Figure 3:
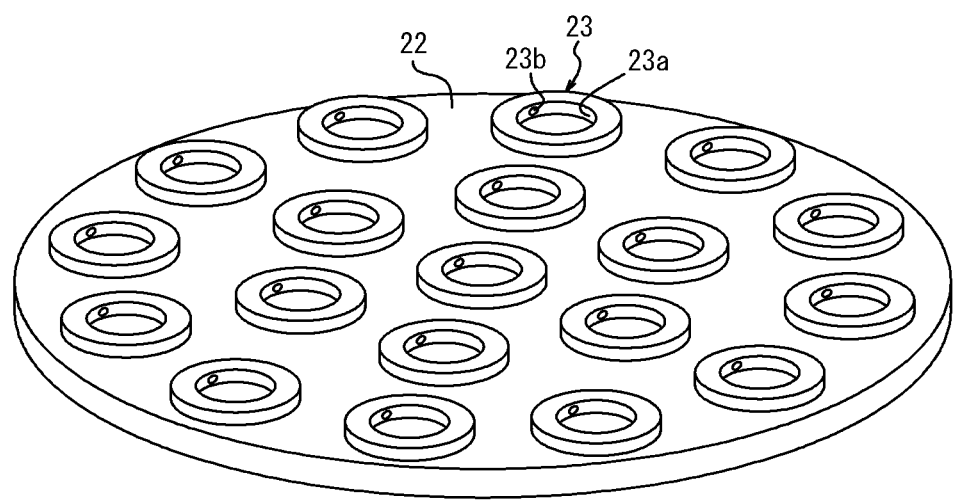
FIG. 3 is a diagram illustrating an example of a tray provided with a plurality of ring-shaped protrusions.

FIG. 2 illustrates an example of a Bernoulli type temporary cradle. Note that like features in FIG. 1 and FIG. 2 are denoted by the same reference numerals. In a temporary cradle 1 depicted in FIG. 2, a tray 22 has a plurality of ring-shaped protrusions 23 as depicted in FIG. 3. Further, an inner wall 23a of each protrusion 23 is provided with a spray hole 23b through which a liquid L is sprayed along the inner wall 23a, and each spray hole 23b is connected to a liquid supply tube 24 placed inside the tray 22. When the liquid L such as pure water is sprayed from the spray hole 23b, a swirling flow is created inside the protrusion 23, which makes it possible to hold the semiconductor wafer W by suction without contact.

In such a temporary cradle 1, after spraying of the liquid L from the spray hole 23b provided in each ring-shaped protrusion 23 of the tray 22 is started and the semiconductor wafer W is placed on the retainer portion 11, the tray 22 is then raised by the elevating mechanism (not shown) with the surface of the semiconductor wafer W to be polished being held by the tray by suction without contact, and the semiconductor wafer W is transferred to the polishing head of the single-side polishing apparatus. This can prevent from making scratches on the surface of the semiconductor wafer W when the semiconductor wafer W is transferred to the polishing head.

Now, the present inventor studied conditions under which the semiconductor wafer W was transferred to the polishing head using the temporary cradle 1 depicted in FIG. 2, and in the study, the surface of the semiconductor wafer W transferred to the polishing head under a given set of conditions was polished using the single-side polishing apparatus and the quality of the surface of the semiconductor wafer W was evaluated using a surface inspection system in an inspection step after cleaning. As a result, the number of light point defects (LPDs) was found to be smaller than that for semiconductor wafers W having been transferred under the other sets of conditions.

Specifically, as will be described in Examples below, when a period of time during which the semiconductor wafer W was held by the temporary cradle 1 (hereinafter, may be referred to as "hold time") was 5 s or more, or when the area ratio of the ring-shaped protrusions 23 provided on the surface of the tray 22 was 15% or more, the number of LPDs counted in the inspection step was found to be small.

The number of the LPDs was small conceivably because the surface of the semiconductor wafer W to be polished was cleaned by the swirling flow of the liquid L sprayed from each spray hole 23b in the Bernoulli type temporary cradle 1. Thus, the present inventor found that the use of the Bernoulli type temporary cradle 1 depicted in FIG. 2 makes it possible to not only transfer the semiconductor wafer W to the polishing head without damaging the surface but also clean the surface of the semiconductor wafer W, resulting in the reduced number of LPDs.

Note that the "hold time" means a period of time from a point at which the semiconductor wafer W is placed on the retainer portion 11 with the liquid L being sprayed from the spray hole 23b in each ring-shaped protrusion 23 provided on the tray 22 at a predetermined flow rate (first flow rate) to a point at which the tray is lowered or the spraying of the fluid L is terminated after the semiconductor wafer W is transferred to the polishing head with the semiconductor wafer W being held by the tray 22 by suction without contact.

Further, the "area ratio of ring-shaped protrusions" means the ratio (percentage) of the total area of the plurality of ring-shaped protrusions 23 to the area of the semiconductor wafer W, and the area of each ring protrusion 23 is the area of the bore in the protrusion 23.

Note that the flow rate of the liquid L during a period from the raising of the tray 22 to the attaching of the semiconductor wafer W to the polishing head (second flow rate) is preferably higher than the first flow rate. This can increase the cleaning effect on the surface of the semiconductor wafer W as described in Examples below.

Further, in order to increase the cleaning effect on the surface of the semiconductor wafer W to be polished, it is possible that the semiconductor wafer W is transferred to the polishing head by the temporary cradle 1, and after the tray 22 is lowered, the surface of the semiconductor wafer W is polished using the single-side polishing apparatus, followed by removal of the semiconductor wafer W from the polishing head, and then spraying of the liquid L from each spray hole 23b at the first flow rate is started again, then the semiconductor wafer W having been polished is placed on the retainer portion 11 to hold the surface of the semiconductor wafer W to be polished by suction without contact with the tray, and the tray 22 is then raised to attach the semiconductor wafer W to the polishing head.

Thus, this disclosure makes it possible to prevent from making scratches on the surface of the semiconductor wafer W to be polished, and transfer the semiconductor wafer W to the polishing head while the surface of the semiconductor wafer W is cleaned.

(Method of Producing Semiconductor Wafer)

A method of producing a semiconductor wafer, according to this disclosure includes: slicing a single crystal silicon ingot grown by a given method to obtain a semiconductor wafers; subjecting the semiconductor wafer obtained to lapping, etching, and double-side polishing; then transferring the semiconductor wafer to a single-side polishing apparatus by the above method of transferring a semiconductor wafer to a polishing apparatus, according to this disclosure; and polishing a surface of the semiconductor wafer to be polished, by the single-side polishing.

As described above, the method of transferring a semiconductor wafer to a polishing apparatus, according to this disclosure makes it possible to prevent from making scratches on the surface of the semiconductor wafer W to be polished, and the semiconductor wafer W can be transferred to the polishing head while the surface of the semiconductor wafer W is cleaned. Thus, a silicon wafer having few LPDs can be produced.

The above semiconductor wafer is not limited, and a silicon wafer having few LPDs can be preferably produced.

EXAMPLES

Examples of this disclosure will now be described in detail; however, this disclosure is not limited to Examples below.

Example 1

A tray having a surface provided with five ring-shaped protrusions with an inner diameter of 30 mm (area ratio: 5%) was prepared and placed on the temporary cradle 1 depicted in FIG. 2. Next, pure water was supplied at a flow rate of 1 L/min from the spray hole 23b provided in the inner wall 23a of each annular protrusion 23, and a silicon wafer with a diameter of 300 mm was placed on the retainer portion 11. Subsequently, the tray 22 was raised with a surface of the silicon wafer being held by suction without contact by the tray 22, thereby transferring the silicon wafer to the polishing head. The hold time of the silicon wafer here was 2 s. The conditions under which the silicon wafer was transferred are given in Table 1.

TABLE 1

| Levels | Outer diameter of ring-shaped protrusions (mm) | Number of ring-shaped protrusions | Area ratio of ring-shaped protrusions (%) | Hold time of wafer (s) | Changing flow rate | Repeating transferring of wafer | Number of LPDs |
|---|---|---|---|---|---|---|---|
| Example 1 | 30 | 5 | 5 | 2 | no | no | 43 |
| Example 2 | 30 | 15 | 15 | 2 | no | no | 23 |
| Example 3 | 30 | 28 | 28 | 2 | no | no | 25 |
| Example 4 | 30 | 65 | 65 | 2 | no | no | 24 |
| Example 5 | 30 | 5 | 5 | 5 | no | no | 23 |
| Example 6 | 30 | 5 | 5 | 10 | no | no | 24 |
| Example 7 | 30 | 5 | 5 | 60 | no | no | 25 |
| Example 8 | 30 | 5 | 5 | 2 | yes | no | 36 |
| Example 9 | 30 | 5 | 5 | 2 | no | yes | 33 |
| Example 10 | 80 | 1 | 7.1 | 2 | no | no | 60 |
| Example 11 | 80 | 2 | 14.2 | 2 | no | no | 23 |
| Example 12 | 80 | 4 | 28.4 | 2 | no | no | 22 |
| Example 13 | 80 | 5 | 35.6 | 2 | no | no | 25 |
| Example 14 | 80 | 9 | 64 | 2 | no | no | 25 |
| Example 15 | 120 | 1 | 16 | 2 | no | no | 24 |
| Example 16 | 120 | 2 | 32 | 2 | no | no | 22 |
| Example 17 | 120 | 4 | 64 | 2 | no | no | 23 |

Example 2

A silicon wafer was transferred to the polishing head as in Example 1. However, the number of the ring-shaped protrusions 23 provided on the tray 22 was 15 (area ratio: 15%). All the other conditions were the same as those in Example 1. The conditions under which the silicon wafer was transferred are given in Table 1.

Example 3

A silicon wafer was transferred to the polishing head as in Example 1. However, the number of the ring-shaped protrusions 23 provided on the tray 22 was 28 (area ratio: 28%). All the other conditions were the same as those in Example 1. The conditions under which the silicon wafer was transferred are given in Table 1.

Example 4

A silicon wafer was transferred to the polishing head as in Example 1. However, the number of the ring-shaped protrusions 23 provided on the tray 22 was 65 (area ratio: 65%). All the other conditions were the same as those in Example 1. The conditions under which the silicon wafer was transferred are given in Table 1.

Example 5

A silicon wafer was transferred to the polishing head as in Example 1. However the hold time of the silicon wafer was 5 s. All the other conditions were the same as those in Example 1. The conditions under which the silicon wafer was transferred are given in Table 1.

Example 6

A silicon wafer was transferred to the polishing head as in Example 1. However the hold time of the silicon wafer was 10 s. All the other conditions were the same as those in Example 1. The conditions under which the silicon wafer was transferred are given in Table 1.

Example 7

A silicon wafer was transferred to the polishing head as in Example 1. However the hold time of the silicon wafer was 60 s. All the other conditions were the same as those in Example 1. The conditions under which the silicon wafer was transferred are given in Table 1.

Example 8

A silicon wafer was transferred to the polishing head as in Example 1. However, the flow rate of pure water during a period from the start of the raising of the tray 22 to the transferring of the silicon wafer to the polishing head was changed to 2 L/min. All the other conditions were the same as those in Example 1. The conditions under which the silicon wafer was transferred are given in Table 1.

Example 9

A silicon wafer was transferred to the polishing head as in Example 1. However, after the silicon wafer was transferred to the polishing head, the surface of the silicon wafer to be polished was polished using a single-side polishing apparatus, followed by removal of the silicon wafer from the polishing head, then spraying of pure water from each spray hole 23b at a flow rate of 1 L/min was started again, then the semiconductor wafer W having been polished was placed on the retainer portion 11 to hold the surface of the semiconductor wafer W to be polished by the tray by suction without contact, and the tray 22 was then raised to attach the semiconductor wafer W to the polishing head. All the other conditions were the same as those in Example 1. The conditions under which the silicon wafer was transferred are given in Table 1.

Example 10

A silicon wafer was transferred to the polishing head as in Example 1. However, the inner diameter of the ring-shaped protrusions 23 provided on the tray 22 was 80 mm and the number of the ring-shaped protrusions 23 was 1 (area ratio: 7.1%). All the other conditions were the same as those in Example 1. The conditions under which the silicon wafer was transferred are given in Table 1.

Example 11

A silicon wafer was transferred to the polishing head as in Example 1. However, the inner diameter of the ring-shaped protrusions 23 provided on the tray 22 was 80 mm and the number of the ring-shaped protrusions 23 was 2 (area ratio: 14.2%). All the other conditions were the same as those in Example 1. The conditions under which the silicon wafer was transferred are given in Table 1.

Example 12

A silicon wafer was transferred to the polishing head as in Example 1. However, the inner diameter of the ring-shaped protrusions 23 provided on the tray 22 was 80 mm and the number of the ring-shaped protrusions 23 was 4 (area ratio: 28.4%). All the other conditions were the same as those in Example 1. The conditions under which the silicon wafer was transferred are given in Table 1.

Example 13

A silicon wafer was transferred to the polishing head as in Example 1. However, the inner diameter of the ring-shaped protrusions 23 provided on the tray 22 was 80 mm and the number of the ring-shaped protrusions 23 was 5 (area ratio: 35.6%). All the other conditions were the same as those in Example 1. The conditions under which the silicon wafer was transferred are given in Table 1.

Example 14

A silicon wafer was transferred to the polishing head as in Example 1. However, the inner diameter of the ring-shaped protrusions 23 provided on the tray 22 was 80 mm and the number of the ring-shaped protrusions 23 was 9 (area ratio: 64%). All the other conditions were the same as those in Example 1. The conditions under which the silicon wafer was transferred are given in Table 1.

Example 15

A silicon wafer was transferred to the polishing head as in Example 1. However, the inner diameter of the ring-shaped protrusions 23 provided on the tray 22 was 120 mm and the number of the ring-shaped protrusions 23 was 1 (area ratio: 16%). All the other conditions were the same as those in Example 1. The conditions under which the silicon wafer was transferred are given in Table 1.

Example 16

A silicon wafer was transferred to the polishing head as in Example 1. However, the inner diameter of the ring-shaped protrusions 23 provided on the tray 22 was 120 mm and the number of the ring-shaped protrusions 23 was 2 (area ratio: 32%). All the other conditions were the same as those in Example 1. The conditions under which the silicon wafer was transferred are given in Table 1.

Example 17

A silicon wafer was transferred to the polishing head as in Example 1. However, the inner diameter of the ring-shaped protrusions 23 provided on the tray 22 was 120 mm and the number of the ring-shaped protrusions 23 was 4 (area ratio: 64%). All the other conditions were the same as those in Example 1. The conditions under which the silicon wafer was transferred are given in Table 1.

For Examples 1 to 17 above, the silicon wafer transferred to the polishing head was subjected to single-side polishing using the single-side polishing apparatus, and the silicon wafer was then cleaned, followed by counting of LPDs using a surface inspection system (Surfscan SP5 manufactured by KLA-Tencor Corporation). The measurement mode used was the DCO (Darkfield Composite Oblique) mode, and LPDs of 19 nm or more were counted. The results are given in Table 1. From Table 1, for wafers with 25 or fewer LPDs, the numbers of the LPDs almost converged, thus such wafers can be determined as good items, whereas wafers with more than 25 LPDs are be determined to have deposits and can be determined as nonconforming items.

Comparing Examples 1 to 4, as the area ratio increases with increase in the number of ring-shaped protrusions 23, the number of LPDs was evidently reduced. However, when the area ratio was 15% or more, the numbers of LPDs were evidently almost the same. Similar results were obtained in Examples 10 to 14 and Examples 15 to 17 where the inner diameter of the ring-shaped protrusions 23 was changed.

Further, comparing Example 1 and Examples 5 to 7, when the hold time of the silicon wafer was longer, the number of LPDs was evidently smaller. However, when the hold time was 5 s or more, the numbers of LPDs were evidently almost the same.

Further, comparing Example 1 and Example 8, when the flow rate of pure water during a period from the raising of the tray 22 to the transferring of the silicon wafer to the polishing head was increased, the number of LPDs was evidently smaller. Further, comparing Example 1 and Example 9, when the transferring of the silicon wafer to the polishing head was repeated, the number of LPDs was evidently smaller.

INDUSTRIAL APPLICABILITY

The disclosed methods are useful in the semiconductor wafer manufacturing industry, since they make it possible to transfer a semiconductor wafer to a single-side polishing apparatus without forming scratches on the surface of the semiconductor wafer.

REFERENCE SIGNS LIST 1, 100: Temporary cradle
11: Retainer portion
12, 22: Tray
13: Guide portion
23: Ring-shaped protrusion
23a: Inner wall
23b: Spray hole
24: Liquid supply tube
L: Liquid
W: Semiconductor wafer

The invention claimed is:

1. A method of transferring a semiconductor wafer to be polished to a single-side polishing apparatus by placing the semiconductor wafer on a temporary cradle, and then, transferring the semiconductor wafer to a polishing head of the single-side polishing apparatus,
the temporary cradle comprising:
a retainer portion that holds a peripheral portion of the semiconductor wafer;
a tray that is configured to be liftable and has a plurality of ring-shaped protrusions on a surface of the tray, with each protrusion having an inner wall provided with a spray hole through which a liquid is sprayed along the inner wall, such that the semiconductor wafer is held by suction without contact by spraying the liquid from each spray hole; and
a guide portion that is placed around the semiconductor wafer and aligns the semiconductor wafer when the semiconductor wafer is raised by raising the tray,
the method comprising:
starting to splay the liquid from each spray hole at a first flow rate;
placing the semiconductor wafer on the retainer portion to hold a surface to be polished of the semiconductor wafer by suction without contact with the tray, and raising the tray to attach the semiconductor wafer to the polishing head after that,
wherein a period of time from a point at which the semiconductor wafer is held by the retainer portion to a point at which the attaching of the semiconductor wafer to the polishing head is completed is 5 s or more.

2. The method of transferring a semiconductor wafer to a polishing apparatus, according to claim 1, wherein a flow rate of the liquid during a period from the raising of the tray to the attaching of the semiconductor wafer to the polishing head is a second flow rate higher than the first flow rate.

3. The method of transferring a semiconductor wafer to a polishing apparatus, according to claim 1, wherein after the semiconductor wafer is transferred to the polishing head, the surface of the semiconductor wafer to be polished is polished using the single-side polishing apparatus; the semiconductor wafer is then removed from the polishing head, followed by starting spraying of the liquid from each spray hole at the first flow rate again; the semiconductor wafer having been polished is then placed on the retainer portion to hold the polished surface of the semiconductor wafer by suction without contact with the tray; and the tray is raised to attach the semiconductor wafer to the polishing head after that.

4. A method of producing a semiconductor wafer, comprising:
slicing a single crystal ingot grown by a given method to obtain semiconductor wafers;
subjecting the semiconductor wafer obtained to lapping, etching, and double-side polishing; and
then transferring the semiconductor wafer to a single-side polishing apparatus by the method of transferring a semiconductor wafer to a polishing apparatus, according to claim 1; and
polishing a surface of the semiconductor wafer by the single-side polishing.

5. The method of producing a semiconductor wafer, according to claim 4, wherein the semiconductor wafer is a silicon wafer.

6. A method of producing a semiconductor wafer, comprising:
slicing a single crystal ingot grown by a given method to obtain semiconductor wafers;
subjecting the semiconductor wafer obtained to lapping, etching, and double-side polishing; and
then transferring the semiconductor wafer to a single-side polishing apparatus by the method of transferring a semiconductor wafer to a polishing apparatus, according to claim 2; and
polishing a surface of the semiconductor wafer by the single-side polishing.

7. The method of producing a semiconductor wafer, according to claim 6, wherein the semiconductor wafer is a silicon wafer.

8. A method of producing a semiconductor wafer, comprising:
slicing a single crystal ingot grown by a given method to obtain semiconductor wafers;
subjecting the semiconductor wafer obtained to lapping, etching, and double-side polishing; and
then transferring the semiconductor wafer to a single-side polishing apparatus by the method of transferring a semiconductor wafer to a polishing apparatus, according to claim 3; and
polishing a surface of the semiconductor wafer by the single-side polishing.

9. The method of producing a semiconductor wafer, according to claim 8, wherein the semiconductor wafer is a silicon wafer.

10. A method of transferring a semiconductor wafer to be polished to a single-side polishing apparatus by placing the semiconductor wafer on a temporary cradle, and then, transferring the semiconductor wafer to a polishing head of the single-side polishing apparatus,
the temporary cradle comprising:
a retainer portion that holds a peripheral portion of the semiconductor wafer;
a tray that is configured to be liftable and has a plurality of ring-shaped protrusions on a surface of the tray, with each protrusion having an inner wall provided with a spray hole through which a liquid is sprayed along the inner wall, such that the semiconductor wafer is held by suction without contact by spraying the liquid from each spray hole; and
a guide portion that is placed around the semiconductor wafer and aligns the semiconductor wafer when the semiconductor wafer is raised by raising the tray,
the method comprising:
starting to splay the liquid from each spray hole at a first flow rate;
placing the semiconductor wafer on the retainer portion to hold a surface to be polished of the semiconductor wafer by suction without contact with the tray, and raising the tray to attach the semiconductor wafer to the polishing head after that,
wherein a ratio of a total area of the plurality of ring-shaped protrusions to an area of the semiconductor wafer is 15% or more.

11. The method of transferring a semiconductor wafer to a polishing apparatus, according to claim 10, wherein a flow rate of the liquid during a period from the raising of the tray to the attaching of the semiconductor wafer to the polishing head is a second flow rate higher than the first flow rate.

12. The method of transferring a semiconductor wafer to a polishing apparatus, according to claim 10, wherein after the semiconductor wafer is transferred to the polishing head, the surface of the semiconductor wafer to be polished is polished using the single-side polishing apparatus; the semiconductor wafer is then removed from the polishing head, followed by starting spraying of the liquid from each spray hole at the first flow rate again; the semiconductor wafer having been polished is then placed on the retainer portion to hold the polished surface of the semiconductor wafer by suction without contact with the tray; and the tray is raised to attach the semiconductor wafer to the polishing head after that.

13. A method of producing a semiconductor wafer, comprising:
slicing a single crystal ingot grown by a given method to obtain semiconductor wafers;
subjecting the semiconductor wafer obtained to lapping, etching, and double-side polishing; and
then transferring the semiconductor wafer to a single-side polishing apparatus by the method of transferring a semiconductor wafer to a polishing apparatus, according to claim 10; and
polishing a surface of the semiconductor wafer by the single-side polishing.

14. The method of producing a semiconductor wafer, according to claim 13, wherein the semiconductor wafer is a silicon wafer.

15. A method of producing a semiconductor wafer, comprising:
slicing a single crystal ingot grown by a given method to obtain semiconductor wafers;
subjecting the semiconductor wafer obtained to lapping, etching, and double-side polishing; and
then transferring the semiconductor wafer to a single-side polishing apparatus by the method of transferring a semiconductor wafer to a polishing apparatus, according to claim 11; and
polishing a surface of the semiconductor wafer by the single-side polishing.

16. The method of producing a semiconductor wafer, according to claim 15, wherein the semiconductor wafer is a silicon wafer.

17. A method of producing a semiconductor wafer, comprising:
slicing a single crystal ingot grown by a given method to obtain semiconductor wafers;
subjecting the semiconductor wafer obtained to lapping, etching, and double-side polishing; and
then transferring the semiconductor wafer to a single-side polishing apparatus by the method of transferring a semiconductor wafer to a polishing apparatus, according to claim 12; and
polishing a surface of the semiconductor wafer by the single-side polishing.

18. The method of producing a semiconductor wafer, according to claim 17, wherein the semiconductor wafer is a silicon wafer.

* * * * *